US 6,717,875 B2

(12) United States Patent
Park

(10) Patent No.: US 6,717,875 B2
(45) Date of Patent: Apr. 6, 2004

(54) SEMICONDUCTOR MEMORY DEVICE

(75) Inventor: Jong Hun Park, Kyungki-Do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/295,137

(22) Filed: Nov. 15, 2002

(65) Prior Publication Data

US 2003/0103399 A1 Jun. 5, 2003

(30) Foreign Application Priority Data

Nov. 30, 2001 (KR) ........................................ 2001-75439

(51) Int. Cl.$^7$ ................................................ G11C 7/00
(52) U.S. Cl. .................... 365/207; 365/204; 365/208
(58) Field of Search ................. 365/207, 206, 365/208, 204

(56) References Cited

U.S. PATENT DOCUMENTS 5,781,487 A * 7/1998 Jang .......................... 365/204
6,392,944 B1 * 5/2002 Kono ......................... 365/208

* cited by examiner

*Primary Examiner*—Son T. Dinh
(74) *Attorney, Agent, or Firm*—Marshall, Gerstein & Borun LLP

(57) ABSTRACT

The present disclosure relates to a semiconductor memory device. A charge recycling circuit is driven to raise a potential of a restore node and a sensing bar node to a given potential before a sensing operation is performed. After the sensing operation is performed, electric charges discharged from the restore node and from the sensing bar node are stored using the charge recycling circuit and can then be used when a next sensing operation is performed. Therefore, current consumed when the sensing operation is performed can be reduced and the power consumption can be thus reduced.

8 Claims, 4 Drawing Sheets

SEMICONDUCTOR MEMORY DEVICE

BACKGROUND OF THE DISCLOSURE

1. Field of the Disclosure

The present disclosure relates generally to a semiconductor memory device. More particularly, the invention relates to a semiconductor memory device capable of reducing current consumed when a sensing operation is performed and thus can reduce power consumption.

2. Description of Related Art

In order to select a single cell from a DRAM and to read data from the cell, a word line and a bit line pair are typically selected. Because the voltage differential in reading the data of the selected cell is low, however, the selected cell is usually sensed. Typically, all the cells coupled to a single word line are sensed due to refresh. Sensing a cell usually involves applying the potential of the power supply voltage to a restore node of a sense amplifier and applying the potential of the ground voltage to a sensing bar node. Due to this, a large amount of current is typically required to sense the cells of a word line, and much power is consumed. Additionally, this may cause variations in the power supply voltage, leading to errors. Further, it is expected that the power consumption in a low power market using a battery will be an important problem.

After the sensing operation is performed, the word line, the restore node, the sensing bar node, and the bit line pair that were activated during the sensing operation are precharged to a bit line precharge voltage level before a next word line is activated. This may cause electric charges stored at the capacitor, which is charged with a HIGH or LOW level, to be unnecessarily discharged.

SUMMARY OF THE DISCLOSURE

Some embodiments of the present invention may solve one or more (or none) of the above problems. Some embodiments of the present invention provide a semiconductor memory device capable of reducing current consumed when a sensing operation is performed and thus reduce power consumption.

In one embodiment, a semiconductor memory device is provided in which a potential of a restore node and a sensing bar node is raised to a given potential before a sensing operation is performed. After the sensing operation is performed, discharged electric charges may be stored and then used in a next sensing operation. Thus, the power consumption of the semiconductor memory device may be reduced.

In one specific embodiment, a semiconductor memory device is provided. The memory device includes a memory cell array comprising a plurality of cells, and a plurality of sense amplifiers coupled to respective bit lines and respective bit-bar lines of respective cells in the plurality of cells, each of the plurality of sense amplifiers having a first terminal and a second terminal. The memory device also includes a control signal generating circuit, driven by a plurality of signals for sensing the cells of the memory cell array, to generate first–third control signals. The memory device additionally includes first switching means, driven by the first control signal, for supplying the first terminals of the plurality of sense amplifiers with a power supply voltage, and second switching means, driven by the second control signal, for supplying the second terminals of the plurality of sense amplifiers with a ground voltage. The memory device further includes a charge recycling circuit, driven by a power-up signal and the third control signal, to supply the first terminals of the plurality of sense amplifiers with electric charges of a first given potential and to supply the second terminals of the plurality of sense amplifiers with electric charges of a second given potential, or to store the electric charges of the first terminals and to store electric charges of the second terminals, depending on operation of the plurality of sense amplifiers.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
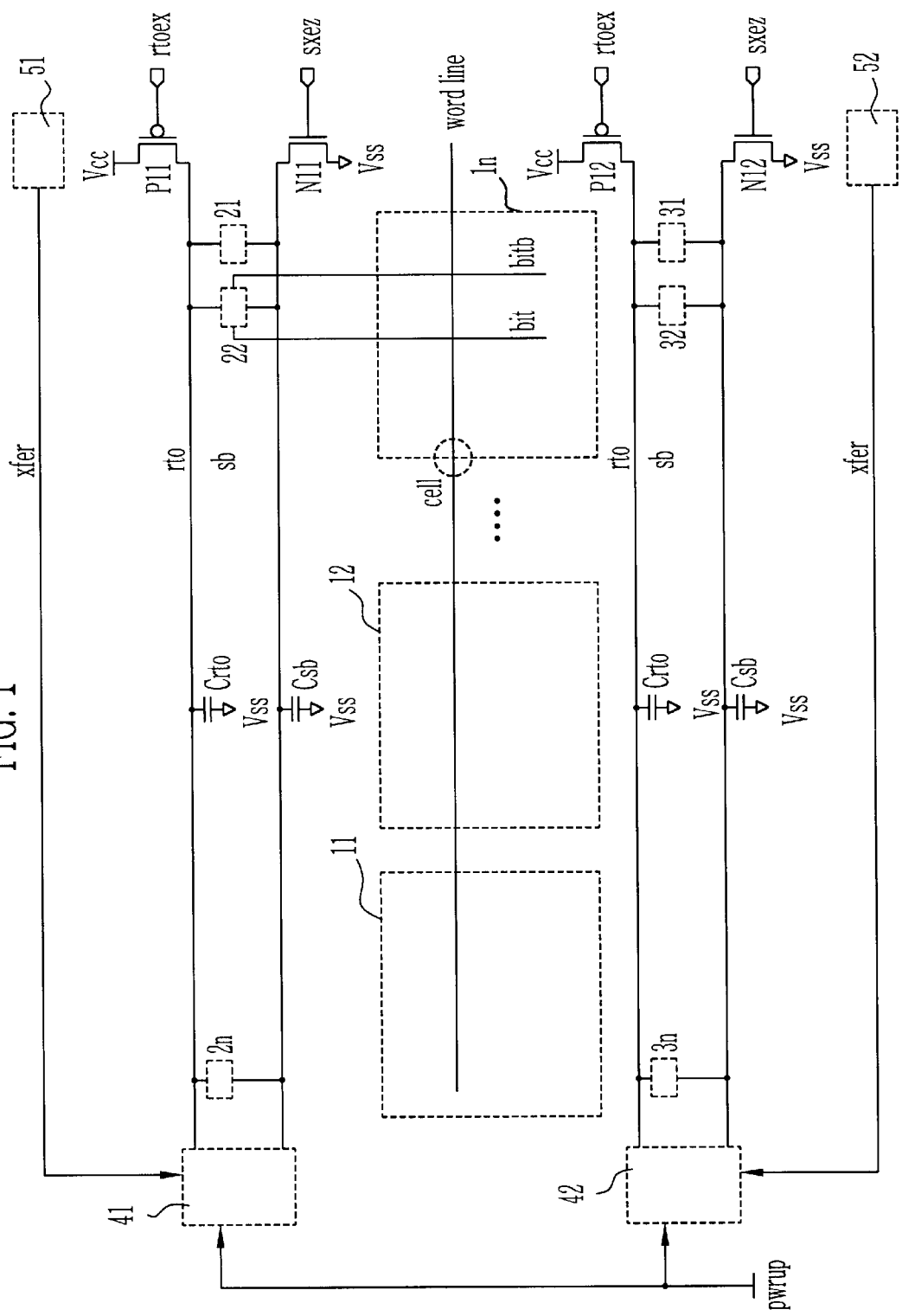
FIG. 1 is a schematic diagram of one embodiment of a semiconductor memory device according to the present invention.

The present invention will be described in detail by way of a preferred embodiment with reference to accompanying drawings, in which like reference numerals are used to identify the same or similar parts.

FIG. 1 is a schematic diagram of one embodiment of a semiconductor memory device according to the present invention.

Referring now to FIG. 1, the semiconductor memory device includes a plurality of memory cell arrays 11–1n, and a plurality of bit line sense amplifiers 21–2n, 31–3n formed depending on a bit line bit and a bit-bar line bitb, which are formed on an upper portion and lower portion of the memory cell array 11–1n. The sense amplifiers 21–2n, 31–3n are coupled to a restore node rto and a sensing bar node sb. PMOS transistors P11 and P12 driven by a first control signal rtoex are coupled between the power supply terminal (Vcc) and the restore node rto. NMOS transistors N11 and N12 driven by a second control signal sxez are coupled between the sensing bar node sb and the ground terminal (Vss). Meanwhile, a first capacitor Crto is coupled between the restore node rto and the ground terminal (Vss). A second capacitor Csb is coupled between the sensing bar node sb and the ground terminal. First and second charge recycling circuits 41 and 42 are driven by a power-up signal pwrup and a third control signal xfer to supply the restore node rto and the sensing bar node sb with the potentials of the sense amplifiers 21–2n, 31–3n. Control signal generating circuits 51 and 52 are driven by a bit line precharge signal blpz, a bit line sense amplifier enable signal sgz and a word line enable address signal pxz to generate the first and second control signals rtoex and sxez and the third control signal xfer for driving the first and second charge recycling circuits 41 and 42.

A method of driving the semiconductor memory device constructed above according to the present invention will be explained below.

If the word line is activated in a state that the plurality of the bit line sense amplifiers 21–2n, 31–3n are coupled by the bit line bit and the bit-bar line bitb on the upper and lower portions of the plurality of the memory cell arrays 11–1n, a small voltage differential is generated by distribution of electric charges of the capacitance of a cell coupled to the bit line and the capacitance of the bit line itself. In order to increase this voltage differential, the first control signal rtoex is applied with a LOW state and the second control signal sxez is applied with a HIGH state, so that the PMOS transistors P11 and P12 and the NMOS transistors N11 and N12 are simultaneously turned on. Thereby, the restore node rto keeps the potential of the power supply voltage (Vcc) and the sensing bar node sb keeps the potential of the ground voltage (Vss). If the third control signal xfer is then applied with a HIGH state, the charge recycling circuits 41 and 42, driven by the third control signal xfer, supply a given potential to the restore node rto and the sensing bar node sb. It is therefore possible to shorten the time to raise the potential of the restore node rto and the sensing bar node sb to a predetermined voltage or lower the potential of the restore node rto and the sensing bar node sb down to a predetermined voltage.

After the sensing operation of the sense amplifiers 21–2n, 31–3n is sufficiently performed, the word line, the restore node rto, the sensing bar node sb, the bit line bit, and the bit-bar line bitb are precharged with the bit line precharge voltage level before a next word line is activated. Also, the stored electric charges are discharged to a capacitor, which will thus be charged with a HIGH level or LOW level. At this time, as the electric charges of a given amount are transferred to the charge recycling circuits 41 and 42 before the capacitor starts to discharge, the voltage that was varied by distribution of the voltage is restored to its original state.

Figure 2:
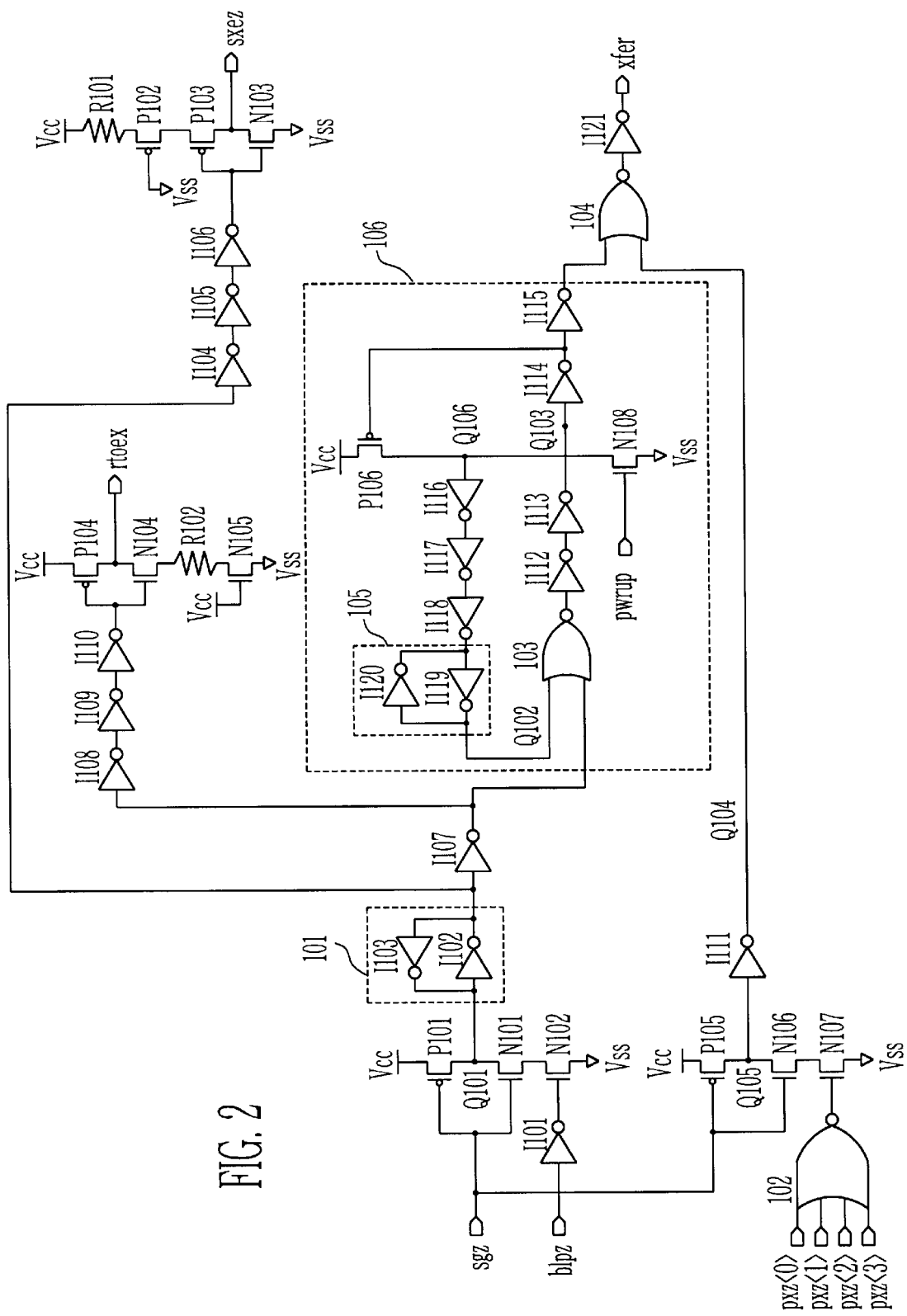
FIG. 2 is a schematic diagram of one embodiment of a control signal generating circuit according to the present invention.

Referring now to FIG. 2, a structure of one embodiment of the control signal generating circuit according to the present invention will be below described.

A first PMOS transistor P101 driven by the bit line sense amplifier enable signal sgz is coupled between the power supply terminal (Vcc) and a first node Q101. A first NMOS transistor N101 driven by the bit line sense amplifier enable signal sgz and a second NMOS transistor N102 driven by a signal of a bit line precharge signal blpz that is inverted by a first inverter I101, are serially coupled between the first node Q101 and the ground terminal Vss. The potential of the first node Q101 is latched in a first latch means 101 having second and third inverters I102 and I103. An output signal of the first latch means 101 is inverted and delayed through fourth–sixth inverters I104–I106 to drive a third PMOS transistor P103 coupled to an output terminal of the second control signal sxez and a third NMOS transistor N103 coupled between the output terminal of the second control signal sxez and the ground terminal (Vss). Meanwhile, the second PMOS transistor P102 for always maintaining a turn-on state, having a gate terminal coupled to the ground voltage (Vss), and a first resistor R101 are coupled between the power supply terminal (Vcc) and the output terminal of the second control signal sxez.

Also, the output signal of the first latch means 101 is delayed through seventh–tenth inverters I107–I110 to drive a fourth PMOS transistor P104 coupled between the power supply Vcc and the output terminal of the first control signal rtoex and a fourth NMOS transistor N104 coupled to the output terminal of the first control signal rtoex. Meanwhile, the fourth NMOS transistor N104, a second resistor R102, and a fifth NMOS transistor N105 for always maintaining a turn-on state, having a gate terminal coupled to the power supply voltage (Vcc), are serially coupled between the output terminal of the first control signal rtoex and the ground terminal (Vss).

A fifth PMOS transistor P105 driven by the bit line sense amplifier enable signal sgz is coupled between the power supply terminal (Vcc) and the fifth node Q105. A sixth NMOS transistor N106 driven by the bit line sense amplifier enable signal sgz and a seventh NMOS transistor N107 driven by an output signal of a first NOR gate 102 for logically combining word line enable address signals pxz<0:3> are coupled between the fifth node Q105 and the ground terminal (Vss). The potential of the fifth node Q105 is inverted by the eleventh inverter I111 and is then applied to one input terminal of a third NOR gate 104.

A reference numeral 106 indicates a post precharge circuit that outputs a pulse of a fixed width. The second NOR gate 103 logically combines the potential of the second node Q102 and the output signal of the seventh inverter I107. An output signal of the second NOR gate 103 is inverted and delayed by twelfth–fourteenth inverters I112–I114 to drive the sixth PMOS transistor P106 coupled between the power supply terminal (Vcc) and the sixth node Q106. An output signal of the second NOR gate 103 is also delayed by the twelfth–fifteenth inverters I112–I115 and is then inputted to the other input terminal of the third NOR gate 104. The potential of the sixth node Q106 is inverted and delayed by sixteenth–eighteenth inverters I116–I118 and is then latched in the second latch means 105 to become the potential of the second node Q102. Meanwhile, the eighth NMOS transistor N108 coupled between the sixth node Q106 and the ground terminal (Vss) is driven by the power-up signal pwrup. Also, the sixth PMOS transistor P106 coupled between the power supply terminal (Vcc) and the sixth node Q106 is driven by an output signal of the fourteenth inverter I114.

The output signal of the third NOR gate 104 is inverted through the twenty-first inverter I121 and is then outputted as the third control signal xfer.

Figure 4:
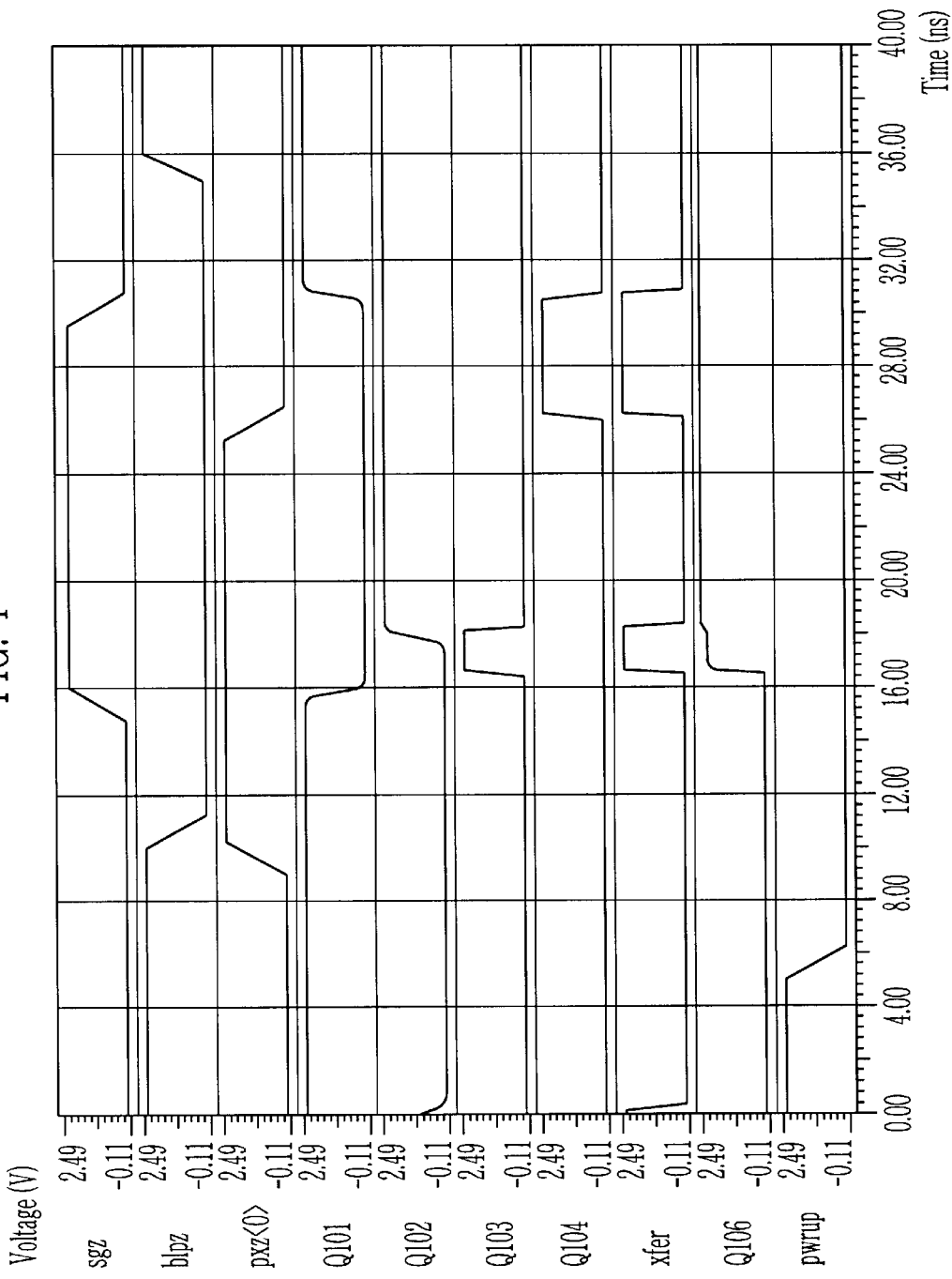
FIG. 4 is a timing diagram for describing one embodiment of a method of driving the semiconductor memory device according to the present invention.

One embodiment of a method of driving the control signal generating circuit constructed above according to the present invention will be described by reference to the timing diagram of FIG. 4.

The bit line sense amplifier enable signal sgz is a signal that could not drive the selected block only since it is a bank global. Therefore, the first and second control signals rtoex and sxez for supplying the power supply to the restore node rto and the sensing bar node sb are generated using the bit line precharge signal blpz that is driven only at the selected block. If the bit line precharge signal blpz is at a LOW state, the bit line precharge signal blpz is inverted to a HIGH state through the first inverter I101, thus turning on the second NMOS transistor N102. Also, the first word line enable address signal pxz<0> may be applied with a HIGH state to enable the word line thereof. The first NOR gate 102 logically combines the first word line enable address signal pxz<0> to output a signal of a LOW state. The seventh NMOS transistor N107 is turned off by the output signal of the first NOR gate 102 that is outputted with a LOW state. In this state, the bit line sense amplifier enable signal sgz is applied with a HIGH state to turn off the first and fifth PMOS transistors P101 and P105 and also to turn on the first and sixth NMOS transistors N101 and N106. Thereafter, the first node Q101 keeps a LOW state and the fifth node Q105 keeps a HIGH state. The potential of the first node Q101 that is maintained as the LOW state is latched in the first latch means 101. As a result, the first latch means 101 outputs a signal of a HIGH state. The output signal of the first latch means 101 that is maintained as the HIGH state is inverted to a LOW state and delayed through the fourth–sixth inverters I104–I106, so that the third PMOS transistor P103 is turned on and the third NMOS transistor N103 is turned off. Therefore, as the power supply voltage (Vcc) is supplied through the first resistor R101 and the second and third PMOS transistors P102 and P103, the second control signal sxez of a HIGH state is outputted.

The output signal of the first latch means 101 that is maintained as the HIGH state is delayed through the seventh–tenth inverters I107–I110 to turn off the fourth PMOS transistor P104 and to turn on the fourth NMOS transistor N104. Therefore, a current path is formed between the output terminal of the first control signal rtoex and the ground terminal (Vss) through the fourth NMOS transistor N104, the second resistor R102 and the fifth NMOS transistor N105, so that the first control signal rtoex of a LOW state is outputted.

As the eighth NMOS transistor N108 is turned on by the power-up signal pwrup, the sixth node Q106 keeps a LOW state. The potential of the sixth node Q106 that is maintained as the LOW state is inverted to a HIGH state and delayed through the sixteenth–eighteenth inverters I116–I118. The second latch means 105 latches the potential of the sixth node Q106 to output a signal of a LOW state. Thus, the second node Q102 maintains a potential of a LOW state. The second NOR gate 103 logically combines the output signal of the seventh inverter I107 that is outputted with a LOW state, and the potential of the second node Q102 that is maintained as the LOW state to output a signal of a HIGH state. Also, the output signal of the second NOR gate 103 that is maintained as the HIGH state is delayed through the twelfth–fifteenth inverters I112–I115 and is then inputted with a HIGH state to the third NOR gate 104. The third NOR gate 104 logically combines the output signal of the fifteenth inverter I115 that is maintained as the HIGH state and the potential of the fourth node Q104 that is maintained as the LOW state in which the potential of the fifth node Q105 that is maintained as the HIGH state are inverted through the eleventh inverter I111, to thus output a signal of a LOW state. The output signal of the third NOR gate 104 that is maintained as the LOW state is inverted to a HIGH state through the twenty-first inverter I121 and is then outputted as the third control signal xfer.

Meanwhile, the output signal of the second NOR gate 103 that is outputted as a HIGH state is inverted to a LOW state through the twelfth–fourteenth inverters I112–I114 to turn on the sixth PMOS transistor P106. At this time, as the power-up signal pwrup is a state that is shifted to a LOW state, the eighth NMOS transistor N108 is turned off. Therefore, the sixth node Q106 keeps a HIGH state. The potential of the sixth node Q106 that is maintained as the HIGH state is inverted to a LOW state and delayed through the sixteenth–eighteenth inverters I116–I118. The second latch means 105 latches the potential of the sixth node Q106 to output a signal of a HIGH state, so that the second node 103 maintains a potential of the HIGH state. The second NOR gate 103 logically combines the output signal of the seventh inverter I107 that is outputted as a LOW state and the potential of the second node 103 that is maintained as the HIGH state to output a signal of a LOW state. The output signal of the second NOR gate 103 that is maintained as the LOW state is delayed through the twelfth–fifteenth inverters I112–I115 and is then inputted with a LOW state to the third NOR gate 104. The third NOR gate 104 logically combines the output signal of the fifteenth inverter I115 that is maintained as the LOW state and the potential of the fourth node Q104 that is maintained as the LOW state to output a signal of a HIGH state. The output signal of the third NOR gate 104 that is maintained as the HIGH state is inverted to a LOW state through the twenty-first inverter I121 and is then outputted as the third control signal xfer.

If all the word line enable address signals pxz<0:3> are shifted to a LOW state to disable the word line, the first NOR gate 102 logically combines all the word line enable address signals pxz<0:3> to output a signal of a HIGH state. Then, the fifth node Q105 shifts the potential of the HIGH state to a potential of a LOW state when the seventh NMOS transistor N107 is turned on. This potential of the LOW state is inverted to a HIGH state through the eleventh inverter I111, so that it becomes the potential of the fourth node Q104. Next, the third NOR gate 104 logically combines the potential of the fourth node Q104 that is maintained as the HIGH state and the output signal of the fifteenth inverter I115 that is maintained as the HIGH state to output a signal of a LOW state. Also, the output signal of the third NOR gate 104 that is maintained as the LOW state is inverted to a HIGH state through the twenty-first inverter I121 and is then outputted as the third control signal xfer.

The bit line sense amplifier enable signal sgz is applied with a LOW state to turn on the first and fifth PMOS transistors P101 and P105 and to turn off the first and sixth NMOS transistors N101 and N106. Therefore, the first node Q101 keeps a HIGH state and the fifth node Q105 also keeps the HIGH state. At this time, the first latch means 101 latches the potential of the first node Q101 that is maintained as the HIGH state to output the first latch means 101 of a LOW state. Also, the output signal of the first latch means 101 that is maintained as the LOW state is inverted to a HIGH state and delayed through the fourth–sixth inverters I104–I106 to turn off the third PMOS transistor P103 and to turn on the third NMOS transistor N103. Therefore, the second control signal sxez of a LOW state is outputted. Further, the output signal of the first latch means 101 that is maintained as the LOW state is delayed through the seventh–tenth inverters I107–I110 to turn on the fourth PMOS transistor P104 and to turn off the fourth NMOS transistor N104. The first control signal rtoex of a HIGH state is thus outputted.

The potential of the sixth node Q106 that is maintained as the HIGH state is inverted to a LOW state and delayed through the sixteenth–eighteenth inverters I116–I118. The second-latch means 105 then latches the potential of the sixth node Q106 to output a signal of a HIGH state, so that the second node Q102 keeps a potential of a HIGH state. The second NOR gate 103 logically combines the output signal of the seventh inverter I107 that is outputted as a HIGH state and the potential of the second node Q102 that is maintained as the LOW state to output a signal of a LOW state. The output signal of the second NOR gate 103 that is maintained as the LOW state is delayed through the twelfth–fifteenth inverters I112–I115 and is then inputted with a LOW state to the third NOR gate 104. Then, the third NOR gate 104 logically combines the output signal of the fifteenth inverter I115 that is maintained as the LOW state and the potential of the fourth node Q104 that is maintained as the LOW state to output a signal of a HIGH state. Next, the output signal of the third NOR gate 104 that is maintained as the HIGH state is inverted to a LOW state through the twenty-first inverter I121 and is then outputted as the third control signal xfer.

As described, if the bit line precharge signal blpz is applied with a LOW state, the bit line sense amplifier enable signal sgz is applied with a HIGH state and one of the word line enable address signals pxz<0:3> is applied with a HIGH state in the control signal generating circuit, the first control signal rtoex is outputted as a HIGH state, the second control signal sxez is outputted as a LOW state and the third control signal xfer is outputted as a HIGH state for a determined time period.

Also, if the word line enable signals pxz<0:3> are shifted to a LOW state to disable the word line in a state that the bit line precharge signal blpz is applied with a LOW state and the bit line sense amplifier enable signal sgz is applied with a HIGH state, the third control signal xfer is outputted as a HIGH state. Next, if the bit line sense amplifier enable signal sgz is shifted to a LOW state, the first control signal rtoex is outputted as a HIGH state, the second control signal sxez is outputted as a LOW state and the third control signal xfer is outputted as a LOW state.

Figure 3:
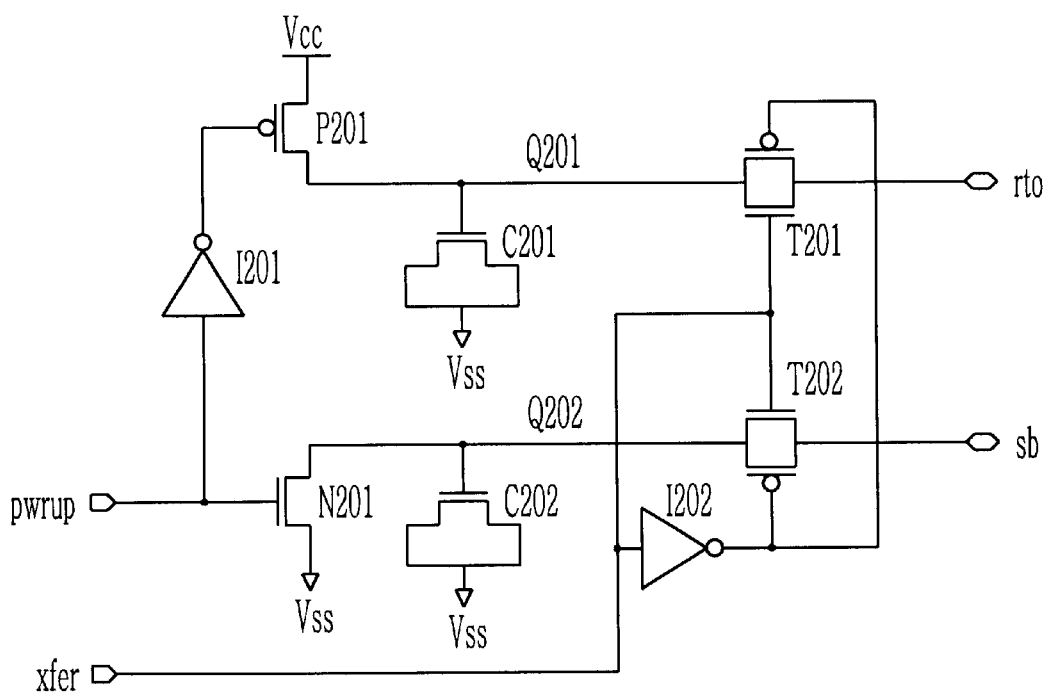
FIG. 3 is a schematic diagram of one embodiment of a charge recycling circuit according to the present invention.

Referring now to FIG. 3, a structure of one embodiment of the charge recycling circuit according to the present invention will be below described.

A first PMOS transistor P201 coupled between the power supply terminal (Vcc) and a first node Q201 is driven by a signal of a power-up signal pwrup that is inverted by the first inverter I201. A first capacitor C201 is coupled to the first node Q201. Also, a first transfer gate T201 that is driven by the third control signal xfer and an output signal of a second inverter I202 for inverting the third control signal xfer is coupled between the first node Q201 and the restore node rto. A first NMOS transistor N201 driven by the power-up signal pwrup is coupled between a second node Q202 and the ground terminal (Vss). A second capacitor C202 is coupled to the second node Q202. Also, the second transfer gate T202 that is driven by the third control signal xfer and an output signal of the second inverter I202 for inverting the third control signal xfer is coupled between the second node Q202 and the sensing bar node sb.

A method of driving the charge recycling circuit constructed above according to the present invention will be below described by reference to the timing diagram of FIG. 4.

If the power-up signal pwrup is applied with a HIGH state, the power-up signal pwrup is inverted to a LOW state through the first inverter I201. Thereby, the first PMOS transistor P201 is turned on by the signal of the LOW state. The power supply voltage (Vcc) is thus supplied to the first node Q201. Therefore, the first node Q201 keeps the potential of the power supply voltage (Vcc) and the first capacitor C201 is charged with electric charges. Meanwhile, the first NMOS transistor N201 is turned on by the power-up signal pwrup applied with a HIGH state and the second node Q202 keeps the potential of the ground voltage (Vss). At this time, the electric charges charged at the second capacitor C202 are discharged to the ground terminal (Vss). At this state, if the power-up signal pwrup is inverted to a LOW state and the third control signal xfer is applied with a HIGH state, the first and second transfer gates T201 and T202 are turned on by the third control signal xfer of a HIGH state and a signal of a LOW state being a signal of the third control signal xfer inverted by the second inverter I202. Therefore, the potential of the first node Q201 is transferred to the restore node rto and the potential of the second node Q202 is also transferred to the sensing bar node sb. Thus, the potential of the first node Q201 has a potential (Vcc-dV) dropped by a voltage that is distributed by the cell capacitance and the capacitance of the bit line itself. Also, the potential of the second node Q202 has a potential (dV) that is raised by that amount.

If the third control signal xfer is shifted to a LOW state, the first and second transfer gates T201 and T202 are turned off, so that connection between the first node Q201 and the restore node rto, and between the second node Q202 and the sensing bar node sb is decoupled.

If the word line enable address signal pxz<0> is shifted to a LOW state to disable the word line after the sensing operation is performed, the third control signal xfer is applied with a HIGH state. Thereby, the first and second transfer gates T201 and T202 are turned on, so that the restore node rto and the first node Q201 are coupled, and the sensing bar node sb and the second node Q202 are also coupled. Therefore, the first node Q201 keeps the potential of the power supply voltage (Vcc) and the second node Q202 keeps the potential of the ground voltage (Vss). Also, if the bit line sense amplifier enable signal sgz is shifted to a LOW state, the first and second transfer gates T201 and T202 are turned off since the third control signal xfer is shifted to a LOW state. Therefore, connection between the restore node rto and the first node Q201 and between the sensing bar node sb and the second node Q202 is decoupled. Further, the first node Q201 keeps the potential of the power supply voltage (Vcc) and the second node Q202 keeps the potential of the ground voltage (Vss).

In the embodiment described above, a charge recycling circuit is driven to raise a potential of a restore node and a sensing bar node to a given potential before a sensing operation is performed. After the sensing operation is performed, electric charges discharged from the restore node and the sensing bar node are stored using the charge recycling circuit, and may then be used when a next sensing operation is performed. Therefore, current consumption when the sensing operation is performed can be reduced and can thus reduce the power consumption.

An embodiment of the present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A semiconductor memory device, comprising:
   a memory cell array comprising a plurality of cells;
   a plurality of sense amplifiers coupled to respective bit lines and respective bit-bar lines of respective cells in the plurality of cells, each of the plurality of sense amplifiers having a first terminal and a second terminal;
   a control signal generating circuit, driven by a plurality of signals for sensing the cells of the memory cell array, to generate first–third control signals;
   first switching means, driven by the first control signal, for supplying the first terminals of the plurality of sense amplifiers with a power supply voltage.
   second switching means, driven by the second control signal, for supplying the second terminals of the plurality of sense amplifiers with a ground voltage;
   a charge recycling circuit, driven by a power-up signal and the third control signal, to supply the first terminals of the plurality of sense amplifiers with electric charges of a first given potential and to supply the second terminals of the plurality of sense amplifiers with electric charges of a second given potential, or to store the electric charges of the first terminals and to store electric charges of the second terminals, depending on operation of the plurality of sense amplifiers.

2. A semiconductor memory device as defined in claim 1, wherein the first switching means is a PMOS transistor driven by the first control signal, and the second switching means is a NMOS transistor driven by the second control signal.

3. A semiconductor memory device as defined in claim 1, wherein the control signal generating circuit comprises:

a first means, driven by a bit line precharge signal and a bit line enable signal, for inverting the bit line enable signal;

a second means for latching an output signal of the first means to generate an output signal;

a third means for delaying the output signal of the second means for a given period of time to generate the first control signal;

a fourth means for inverting and delaying the output signal of the second means to generate the second control signal;

a fifth means for generating a pulse based on an inverted signal of the output signal of the second means and a signal based on the pulse generated by the fifth means;

a sixth means for logically combining a plurality of word line enable address signals;

a seventh means for outputting a signal having an opposite phase to the bit line enable signal or a signal having the same phase to the bit line enable signal, depending on the bit line enable signal and the output signal of the sixth means; and an eighth means for logically combining an inverted signal of the pulse of the fifth means and the output signal of the seventh means to output the third control signal.

4. A semiconductor memory device as defined in claim 3, wherein the fifth means comprises:

a NMOS transistor coupled between a first node and a ground terminal and driven by a power-up signal;

a NOR gate for logically combining an inverted signal of the output signal of the fourth means and the potential of a second node;

a first inverting and delaying means for inverting and delaying an output signal of the NOR gate;

a PMOS transistor coupled between the power supply terminal and the first node and driven by an output signal of the first inverting and delaying means;

a second inverting and delaying means for inverting and delaying the potential of the first node; and a latch means for latching an output signal of the second inverting and delaying means to determine a potential of the second node.

5. A semiconductor memory device as defined in claim 3, wherein the sixth means is a NOR gate.

6. A semiconductor memory device as defined in claim 3, wherein the eighth means is a NOR gate.

7. A semiconductor memory device as defined in claim 1, wherein the charge recycling circuit comprises:

a PMOS transistor coupled between a power supply terminal and a first node and driven by an inverted signal of a power-up signal;

a first capacitor coupled to the first node;

a NMOS transistor coupled between a second node and a ground terminal and driven by the power-up signal;

a second capacitor coupled to the second node;

a first transfer gate driven by the third control signal and an inverted signal of the third control signal to electrically connect the first node and the first terminals of the plurality of sense amplifiers; and a second transfer gate driven by the third control signal and the inverted signal of the third control signal to electrically connect the second node and the second terminals of the plurality of sense amplifiers.

8. A semiconductor memory device as defined in claim 1, wherein the charge recycling circuit supplies the first terminals of the plurality of sense amplifiers with electric charges of a first given potential and supplies the second terminals of the plurality of sense amplifiers with electric charges of a second given potential prior to a sensing operation, and stores the electric charges of the first terminals and stores electric charges of the second terminals after a sensing operation.

* * * * *

UNITED STATES PATENT AND TRADEMARK OFFICE
CERTIFICATE OF CORRECTION

PATENT NO. : 6,717,875 B2
DATED : April 6, 2004
INVENTOR(S) : Park et al.

It is certified that error appears in the above-identified patent and that said Letters Patent is hereby corrected as shown below:

Column 8,
Line 55, please delete "voltage." and replace with -- voltage --.

Signed and Sealed this

Thirty-first Day of August, 2004

JON W. DUDAS
*Director of the United States Patent and Trademark Office*